(12) United States Patent
Feng (10) Patent No.: US 9,433,092 B2
(45) Date of Patent: Aug. 30, 2016

(54) LAYOUT METHOD FOR PRINTED CIRCUIT BOARD AND PRINTED CIRCUIT BOARD THEREOF

(71) Applicant: EverDisplay Optronics (Shanghai) Limited, Shanghai (CN)

(72) Inventor: Dongfang Feng, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/621,003

(22) Filed: Feb. 12, 2015

(65) Prior Publication Data
US 2016/0205777 A1    Jul. 14, 2016

(30) Foreign Application Priority Data

Jan. 8, 2015  (CN) .......................... 2015 1 0010024

(51) Int. Cl.
| H05K 7/10 | (2006.01) |
| H05K 1/11 | (2006.01) |
| H05K 1/02 | (2006.01) |
| H05K 3/40 | (2006.01) |
| H05K 3/10 | (2006.01) |

(52) U.S. Cl.
CPC ............. *H05K 1/111* (2013.01); *H05K 1/0296* (2013.01); *H05K 3/10* (2013.01); *H05K 3/4007* (2013.01)

(58) Field of Classification Search
USPC ........................................ 361/772, 774, 767
See application file for complete search history.

(56) References Cited

U.S. PATENT DOCUMENTS

| 3,665,256 | A | * | 5/1972 | Goun | H01L 21/565 174/15.1 |
| 4,132,341 | A | * | 1/1979 | Bratschun | H01L 21/4853 228/122.1 |
| 4,225,900 | A | * | 9/1980 | Ciccio | H05K 1/144 257/700 |
| 4,303,291 | A | * | 12/1981 | Dines | H05K 1/117 174/261 |
| 5,274,210 | A | * | 12/1993 | Freedman | B23K 1/0056 219/121.63 |
| 5,386,087 | A | * | 1/1995 | Lee | H01R 12/57 174/250 |
| 5,877,033 | A | * | 3/1999 | Matern | H05K 1/0268 257/48 |
| 6,334,782 | B1 | * | 1/2002 | Sasa | H05K 1/0256 174/260 |

FOREIGN PATENT DOCUMENTS

| CN | 1949229 A | 4/2007 |
| CN | 101198217 A | 6/2008 |
| CN | 101996264 A | 3/2011 |

* cited by examiner

*Primary Examiner* — Steven T Sawyer
(74) *Attorney, Agent, or Firm* — Yunling Ren; Eaton & Van Winkle (57) ABSTRACT

A layout method for a printed circuit board, comprising: defining a layout area on the printed circuit board; disposing at least one padstack on the layout area; disposing a welding material area on the padstack to partially cover the padstack and be located at one end of the padstack; disposing a blocking area on the layout area, wherein the blocking area comprises an opening to expose the padstack; and forming a wiring, wherein the wiring is connected with the padstack and the welding material area through the opening without overlapping the blocking area. The layout method for a printed circuit board and the printed circuit board may avoid that the outlet of the wiring is formed through the side of the welding material area to leave a blank area on the padstack.

12 Claims, 7 Drawing Sheets

LAYOUT METHOD FOR PRINTED CIRCUIT BOARD AND PRINTED CIRCUIT BOARD THEREOF

CROSS REFERENCE TO RELATED APPLICATIONS

The present application claims priority under 35 U.S.C. §119 to Chinese Patent Applications No. 201510010024.X, filed on Jan. 8, 2015, the entire contents of which are incorporated herein by reference.

TECHNICAL FIELD

The present disclosure relates to a printed circuit board, and more particularly, to a layout method for the printed circuit board.

BACKGROUND

Presently, component libraries for building layouts of printed circuit boards are established according to data from component manufacturers. When establishing a library, it only needs to establish sizes of the entities of the padstacks, pins and components. However, some components may have two outlet directions, and actually only one outlet direction may have no effect on signal quality, the other direction may have effect on the signal quality. If there happens to select an outlet that has effect on a signal, the quality of the signal of the printed circuit board may be bad, and the quality of a product may be decreased.

Figure 1:
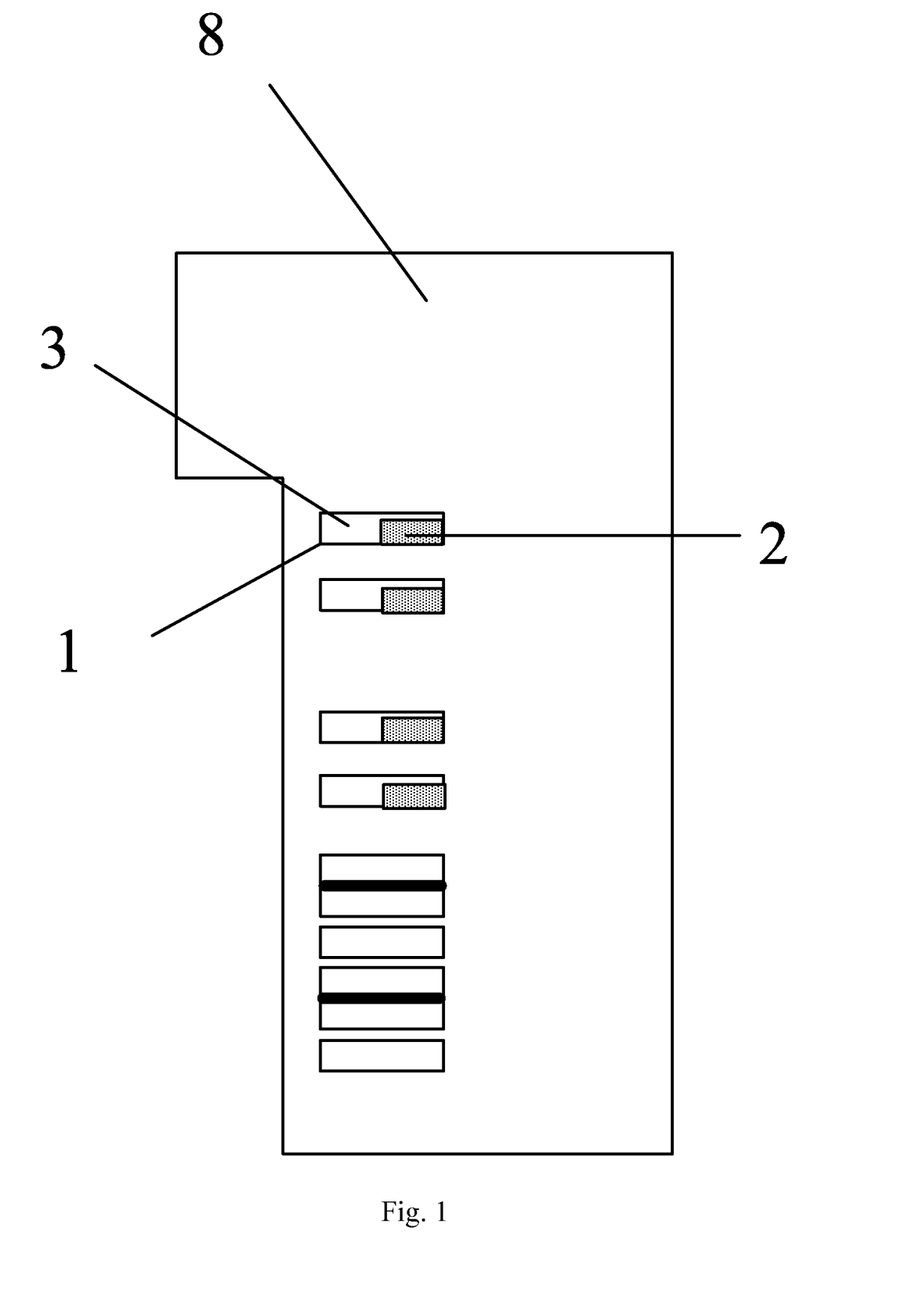
FIG. 1 is a layout of a component library for a printed circuit board in the prior art.

FIG. 1 shows a layout diagram for a printed circuit board. As shown in FIG. 1, a layout area includes at least one padstack 1. A welding material area 2 is included on the padstack. The welding material area 2 is configured to be welded together with an element to be connected, such as an IC (not shown) and the like. Beside the welding material area 2 on the padstack 1, there also provides a blank area 3 on the padstack 1 that is not covered by the welding material area 2. A wiring needs to be connected with the padstack 1 of FIG. 1, so as to connect the element to be connected with other elements. A reference number 8 in FIG. 1 represents a framed layout area which is a part of the entire printed circuit board. For the convenience of description, other parts of the circuit board and other elements on the circuit board are not shown.

The element to be connected in FIG. 1 is welded together with the welding material area 2, and then is lead out through the wiring and connected with other elements, so that the layout in FIG. 1 has two outlet manners.

Figure 2:
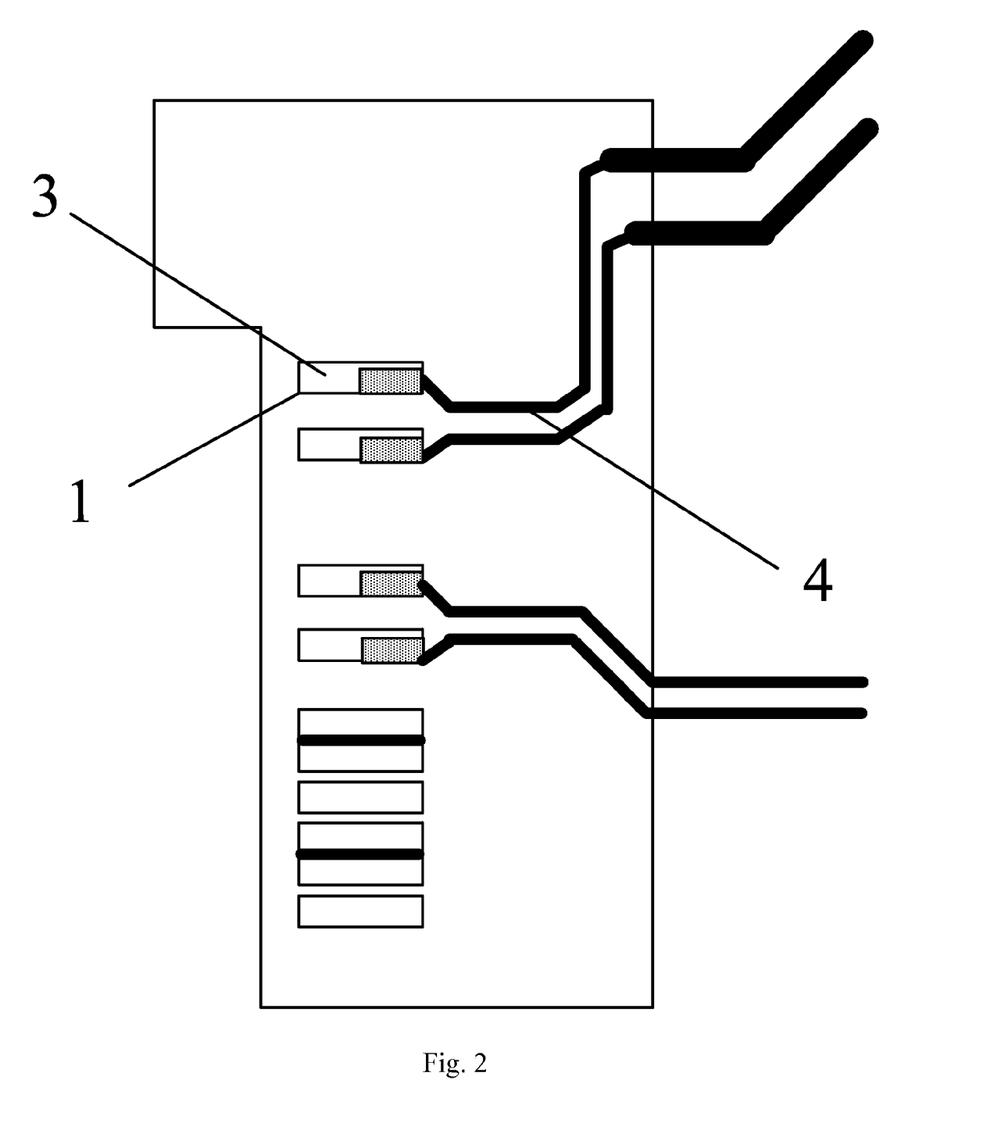
FIG. 2 is a diagram of a first outlet manner according to the layout of FIG. 1 in the prior art.
Figure 3:
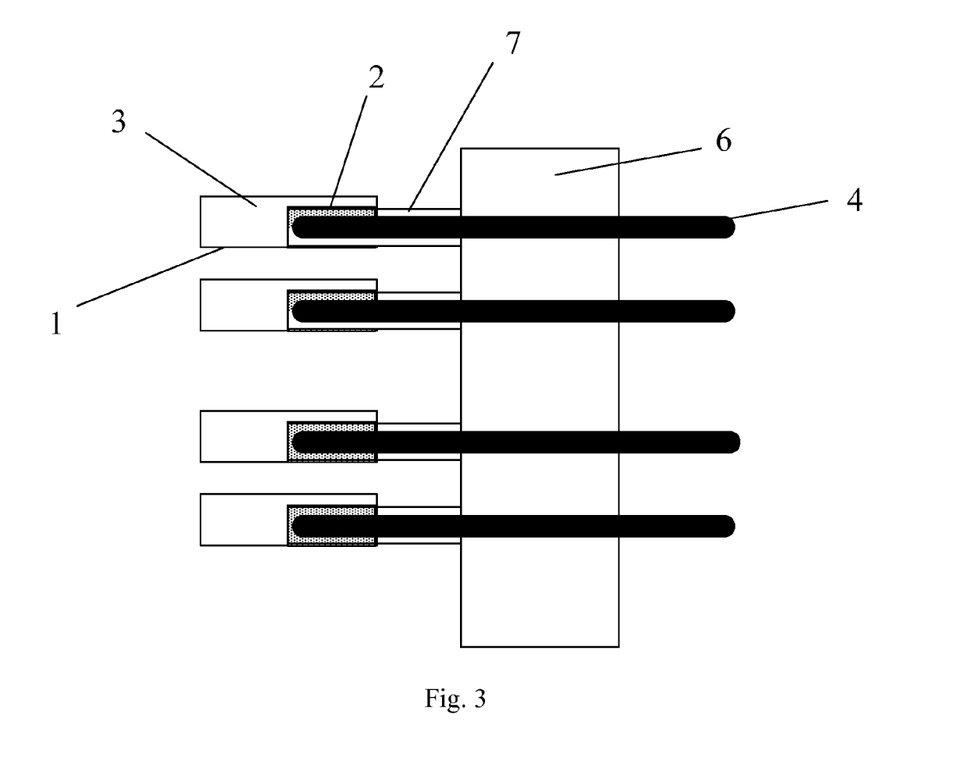
FIG. 3 is a diagram for explaining FIG. 2 in details.

FIG. 2 shows the first outlet manner. FIG. 3 is a diagram that explains FIG. 2 in details. As shown in FIG. 2, the wiring 4 is connected with one side of the padstack 1 where the welding material area 2 is located. The element to be connected is welded on the welding material area 2. The element to be connected is not shown in FIG. 2. In FIG. 3, the element to be connected is represented by a reference number 6. As shown in FIG. 3, a pin 7 on the element to be connected 6, such as an IC, is connected together with the welding material area 2 on the padstack 1, and the wiring 4 is connected together with the welding material area 2, and then extends outwards to be connected with other elements. In the outlet manners as shown in FIG. 2 and FIG. 3, the wiring 4 does not pass through a blank area 3 on the padstack 1 that is not covered by the welding material area 2.

Figure 4:
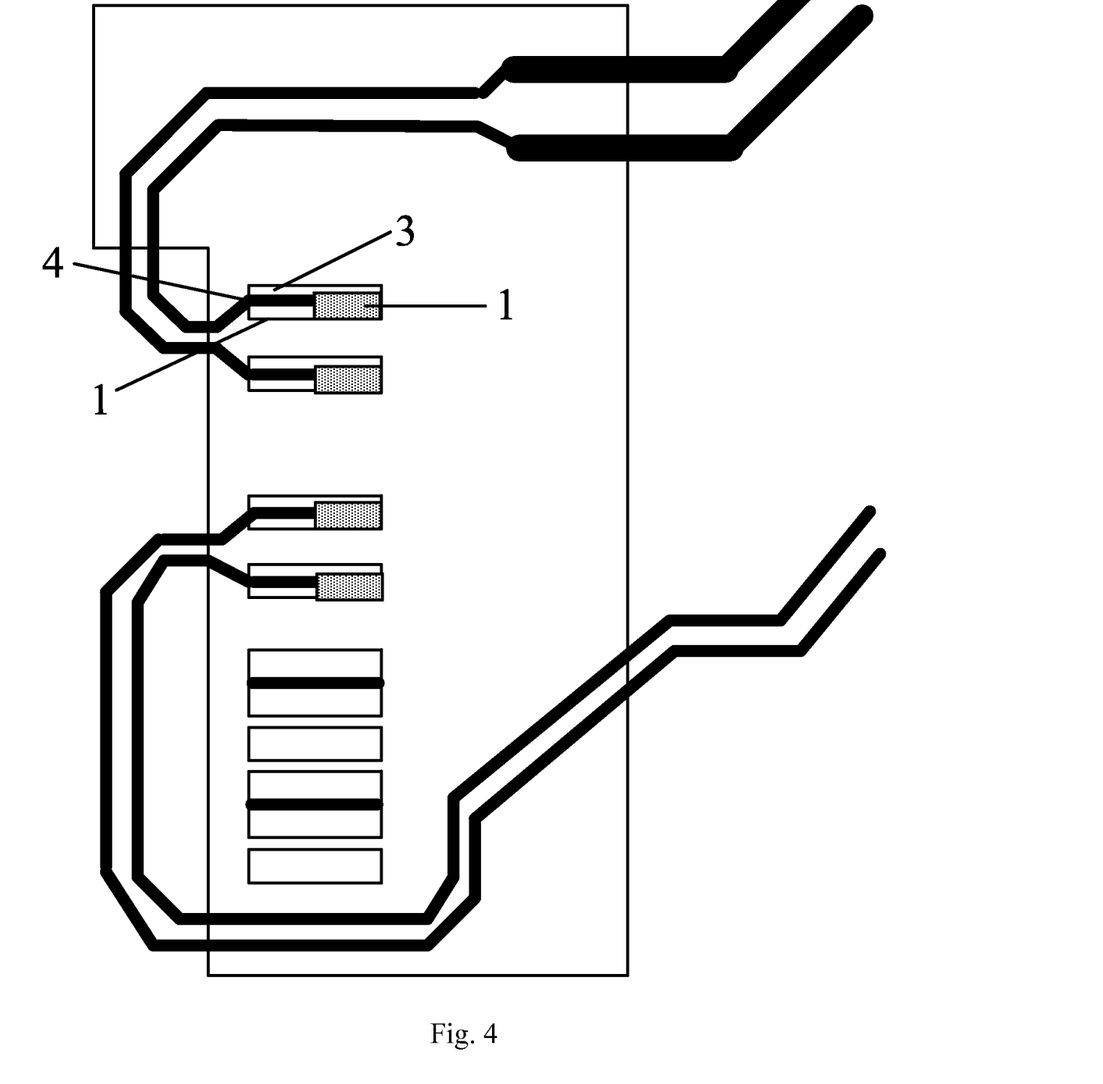
FIG. 4 is a diagram of a second outlet manner according to the layout of FIG. 1 in the prior art.
Figure 5:
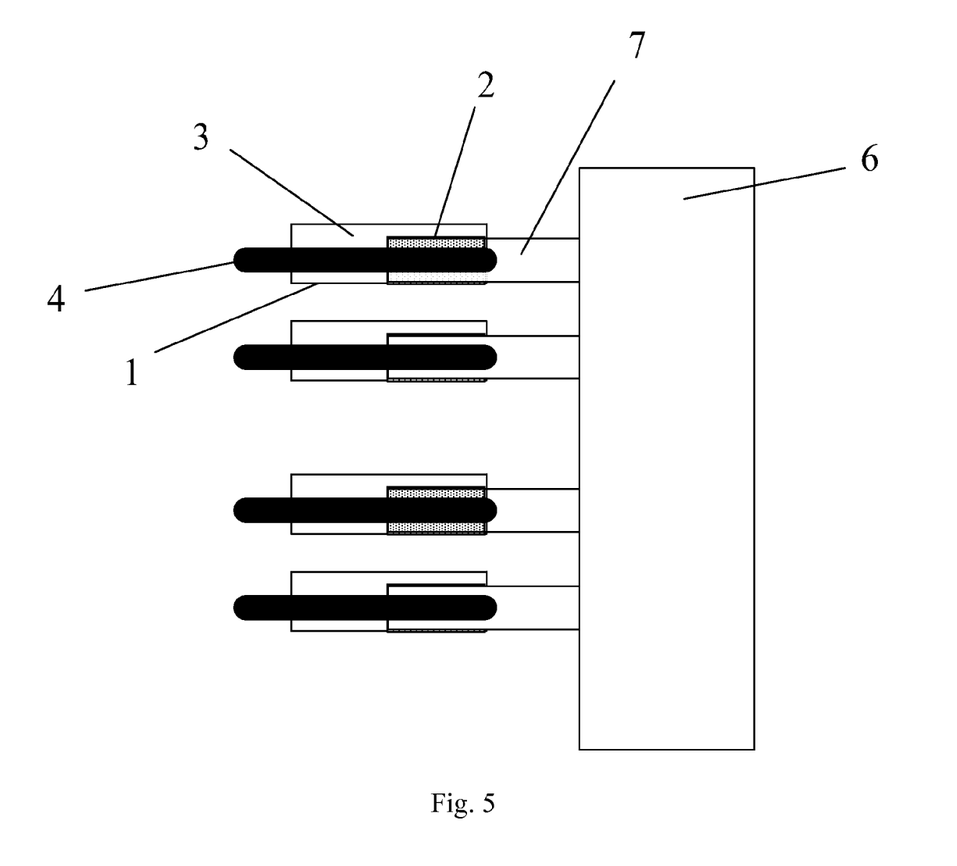
FIG. 5 is a diagram for explaining FIG. 4 in details.

FIG. 4 shows the second outlet manner. FIG. 5 is a diagram that explains FIG. 4 in details. As shown in FIG. 4 and FIG. 5, the wiring 4 is connected together with the welding material area 2 through the blank area 3 on the padstack 1 that is not covered by the welding material area 2, and then is connected with the pin 7 of the element to be connected 6 which is welded on the welding material area 2. In this connection manner, the blank area 3 on the padstack 1 that is not covered by the welding material area 2 is covered by the wiring 4.

In the first outlet manner, the blank area 3 on the padstack 1 that is not covered by the welding material area 2 is reserved, and the blank area 3 on the padstack 1 is not covered by the wiring 4, which is equivalent to leave a small section of blank padstack. This section of blank padstack is a sharp bulge, which is equivalent to an antenna, so it is easy to induce or radiate high frequency signals, such that it may cause bad effects on the quality of signals of the circuit, so as to influence transmission stability of the signals. While the second manner avoids a circumstance that a part of the padstack 1 is left as a blank area since the wiring 4 is also welded on the blank area 3 on the padstack 1 that is not covered by the welding material area 2, such that the padstack 1 does not have a sharp bulge like an antenna, and may not induce or radiate high frequency signals, and thus may not influence the quality of signals of the circuit.

However, both the above two outlet manners may occur in practical applications, and it may not be determined which manner is adopted before outlet, thus there is a possibility of causing bad signal quality of the circuit.

SUMMARY

In order to solve, in part, the above technical problems, the present disclosure provides a layout method for a printed circuit board and a printed circuit board, which may avoid that an outlet of a wiring is formed through the side of a welding material area to leave a blank area on a padstack, so as to solve the problem that the signal quality of the circuit may be bad.

According to a first aspect of the present application, there provides a layout method for a printed circuit board, including: defining a layout area on the printed circuit board; disposing at least one padstack on the layout area; disposing a welding material area on the padstack to partially cover the padstack and be located at one end of the padstack; disposing a blocking area on the layout area, wherein the blocking area includes an opening to expose the padstack; and forming a wiring, wherein the wiring is connected with the padstack and the welding material area through the opening without overlapping the blocking area.

According to a second aspect of the present application, there provides a printed circuit board, including: a layout area; at least one padstack disposed on the layout area; a welding material area disposed on the padstack to partially cover the padstack and be located at one end of the padstack; a blocking area disposed on the layout area, wherein the blocking area includes an opening and the padstack is disposed therein; and a wiring connected with the padstack and the welding material area through the opening without overlapping the blocking area.

The layout method for a printed circuit board and the printed circuit board provided by the present disclosure may avoid that the blank part of the padstack acts as a sharp bulge, so as to provide stable signal quality.

Wherein reference numbers are explained as follows:

1 and 101: padstack; 2 and 201: welding material area; 3 and 301: blank area on the padstack; 4 and 401: wiring; 501: blocking area; 6: element to be connected; and 7: pin on the element to be connected.

DETAILED DESCRIPTION

The present application may be further described in details hereinafter with reference to the accompanying drawings and embodiments. It should be understood that the embodiments described here are explanatory only and do not limit the present application. Moreover, it should be noted that, for the convenience of description, the accompanying drawings only illustrate those parts related to the present application rather than the entire structure.

Figure 6:
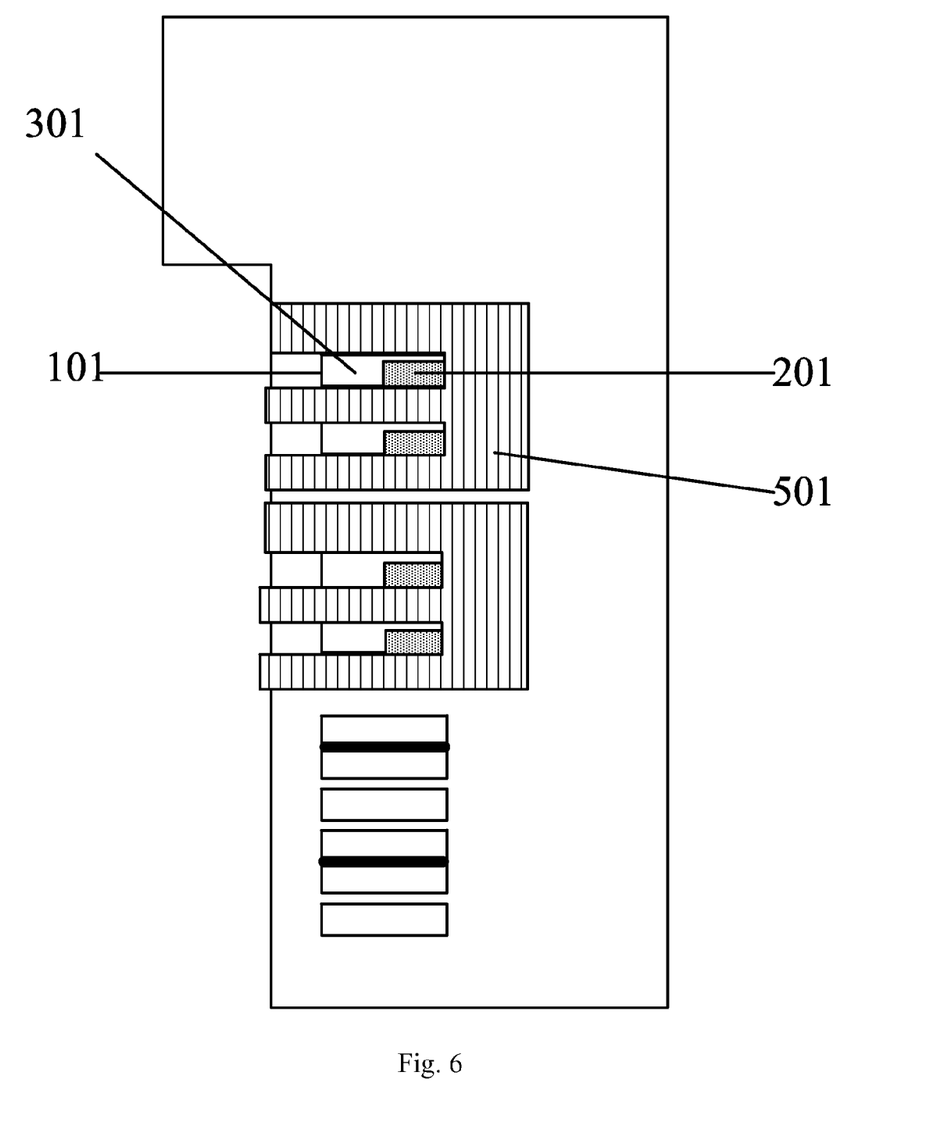
FIG. 6 is a layout of the printed circuit board according to an embodiment of the present application.
Figure 7:
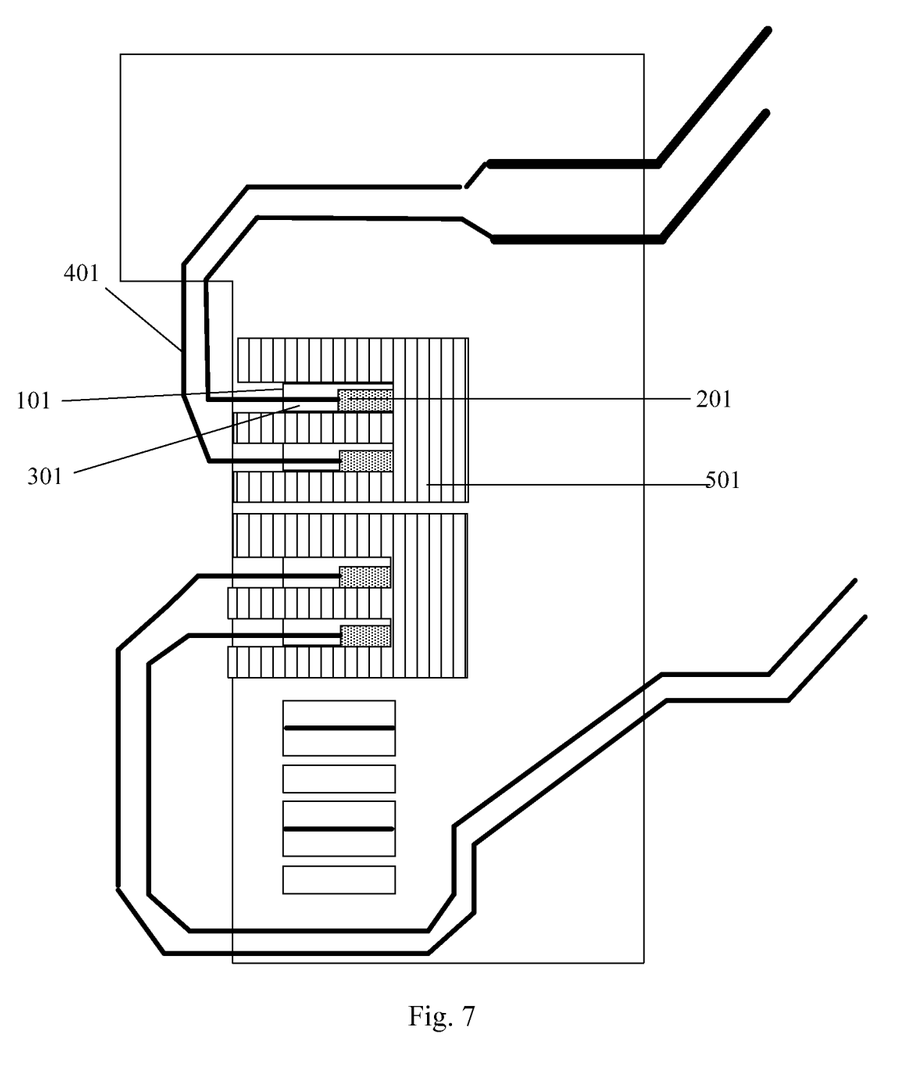
FIG. 7 is a diagram of an outlet manner according to the layout of FIG. 6.

The embodiments of the present application provide a layout method for a printed circuit board. FIG. 6 and FIG. 7 show the layout of the printed circuit board according to the embodiments. As shown in FIG. 6, the layout of the components in the printed circuit board includes a layout area, and at least one padstack 101 is disposed in the layout area. FIG. 6 shows four padstacks. The actual quantity of padstacks can be designed by those skilled in the art as needed. A welding material area 201 is disposed on the padstack 101, which is an area for an element to be connected to contact with the padstack 101. The material of the welding material area 201 is usually soldering paste. The element to be connected or a pin of the element to be connected is welded on the welding material area 201. The element to be connected, such as an integrated circuit, is not shown in FIG. 6. The welding material area 201 is at lest located at one end of the padstack 101, and partially covers the padstack 101. A blank area 301 on the padstack 101 that is not covered by the welding material area 201 is left.

A blocking area 501 is disposed on the periphery of the padstack 101, the blocking area 501 includes an opening to expose the padstack 101, and the padstack 101 is disposed therein. That is, the blocking area 501 encloses the padstack 101 except one side of the padstack 101 opposite to the welding material area 201. The blocking area 501 is marked as an area that a wiring 401 may not pass through. The wiring 401 is required to bypass the blocking area, so as to connect with the padstack 101. Therefore, when the wiring 401 is disposed, the wiring 401 is connected with the padstack 101 and the welding material area 201 through the opening. That is, the wiring 401 overlaps, and connects with the part (i.e., the blank area 301 shown in FIG. 6) on the padstack 101 that is not covered by the welding material area 201, so as to be connected with the welding material area 201. Specifically, the wiring 401 is connected with an element to be connected (such as an IC) or a pin of the element to be connected that is welded on the welding material area 201, and the quantity of the pin being one or more, wherein the wiring 401 does not overlap the blocking area 501. In this way, the wiring 401 enters the padstack 101 from a position that is not enclosed. That is, the wiring 401 passes through the area 301 that is not covered by the welding material area 201, so as to be connected with the welding material area 201 on the padstack 101. In this way, the wiring 401 is welded on the area 301 (see FIG. 7), so that there is no blank part of the padstack 101, thus it is avoided that the blank part of the padstack 101 may serve as a sharp bulge to induce or radiate high frequency signals to influence the signal quality of the circuit.

As shown in FIG. 7, one end of the wiring 401 (the wiring in the embodiment, for instance, is a copper wiring) enters the padstack 101 through one side on the padstack 101 that is not enclosed by the blocking area 501, so as to be connected with the welding material area 201 on the padstack 101. The other end of the wiring 401 extends outwards so as to be connected with other elements. Therefore, the wiring 401 is welded on the blank area 301 that is not covered by the welding material area 201.

The above shows the case that the padstack 101 is in a rectangle. The blocking area 501 encloses three sides of the padstack 101 except one side opposite to the welding material area 201 is not enclosed, so that the wiring is disposed through this one side, so as to avoid leaving a blank area on the padstack 101.

The shape of the padstack may be either in a round or in other shapes. Similarly, the blocking area is employed to enclose the padstack except an area for the outlet of the wiring, so that the part of the padstack that is not covered by the welding material area is welded with the wiring, so as to eliminate the point effect.

The blocking area according to the embodiments of the present application means an area marked in advance in designing where no outlet of the wiring is allowed. The vertical lines used in the drawings are merely on schematic purpose. Actually the blocking area is not composed of lines. The vertical lines only mark the area where no outlet of the wiring is allowed.

The embodiments of the present application further provide a printed circuit board formed according to the above layout method for a printed circuit board. The printed circuit board includes a layout area, wherein the at least one padstack 101 is disposed in the layout area, and the actual quantity of the padstack 101 can be designed by those skilled in the art as needed.

The at least one padstack 101 is provided with the welding material area 201 thereon, and the welding material area 201 partially covers the at least one padstack 101 and is located at one end of the at least one padstack 101. The blocking area 501 is disposed on the layout area, wherein the blocking area 501 includes an opening to expose the padstack 101, and the padstack 101 is disposed therein. The wiring 401 is also disposed in the layout area, wherein the wiring 401 is connected with the padstack 101 and the welding material area 201 through the opening without overlapping the blocking area 501. In this way, the blocking area 501 is disposed at the periphery of the at least one padstack, and the wiring 401 does not pass through the area occupied by the blocking area 501. The wiring 401 bypasses the blocking area 501 so as to be connected with the padstack 101. That is, one end of the wiring 401 enters the padstack 101 through one side of the padstack 101 that is not enclosed by the blocking area 501, so as to be connected with the welding material area 201 on the padstack 101. That is, the wiring overlaps, and connects with the part (i.e., the blank area 301 shown in FIG. 6) on the padstack 101 that is not covered by the welding material area 201, so as to be connected with the welding material area. Specifically, the wiring is connected with the element to be connected (such as an IC) or the pin of the element to be connected that is welded on the welding material area 201. The other end of the wiring 401 extends outwards so as to be connected with other elements. Therefore, the part 301 of the padstack 101 that is not covered by the welding material area 201 is welded with the wiring 401, such that the entire padstack 101 is covered by the wiring 401 and the welding material area 201, thus there is no blank part of the padstack. In this way, it is avoided that the blank part of the padstack acts as a sharp bulge to induce or radiate high frequency signals to influence the signal quality of the circuit.

The layout method for a printed circuit board and the printed circuit board provided by the embodiments of the present application may avoid that the outlet of the wiring is formed through the side of the welding material area on the padstack to leave a blank area on the padstack, such that it is avoided that the blank area of the padstack acts as a sharp bulge to play a role of antenna to induce or radiate high frequency signals, thus the problem that the signal quality of the circuit may be bad is solved.

It should be noted that the above is merely the preferred embodiments and the applied technical principles of the present application. Those skilled in the art may understand that the present application is not limited to the specific embodiments described here and that various apparent changes, readjustment and substitutions can be made by those skilled in the art without departing from the protection scope of the present application. Therefore, although the detailed explanations are made on the present application through the above embodiments, the present application is not limited to the above embodiments, and may further include more other equivalence embodiments without departing from the concept of the present application, thus the scope of the present application is determined by the scope of the appended claims.

What is claimed is:

1. A layout method for a printed circuit board, comprising:
    defining a layout area on the printed circuit board;
    disposing at least one padstack on the layout area;
    disposing a welding material area on the padstack to partially cover the padstack, be located at one end of the padstack, and leave a blank area on the padstack that is not covered by the welding material area, wherein the welding material area is an area for an element to be connected to contact with the padstack, and the element to be connected or a pin of the element to be connected is welded on the welding material area;
    disposing a blocking area on the layout area, wherein the blocking area comprises an opening to expose the padstack, and the blocking area encloses the padstack except on side of the padstack opposite to the welding material area; and
    forming a wiring, wherein the wiring is connected with the padstack and the welding material area through the opening without overlapping the blocking area, and the wiring overlaps, and connects with the blank area on the padstack that is not covered by the welding material area, so as to be connected with the welding material area.

2. The layout method for a printed circuit board according to claim 1, wherein the padstack is in a rectangle, three sides of the padstack are enclosed by the blocking area and one side of the padstock, which is not enclosed by the blocking area, is opposite to the welding material area.

3. The layout method for a printed circuit board according to claim 1, wherein the wiring is connected with the element to be connected or the pin of the element to be connected that is welded on the welding material area.

4. The layout method for a printed circuit board according to claim 2, wherein the wiring is connected with the element to be connected or the pin of the element to be connected that is welded on the welding material area.

5. The layout method for a printed circuit board according to claim 3, wherein at least one of the pin is welded on the welding material area to be connected with the wiring.

6. The layout method for a printed circuit board according to claim 4, wherein at least one of the pin is welded on the welding material area to be connected with the wiring.

7. A printed circuit board, comprising:
    a layout area;
    at least one padstack disposed on the layout area;
    a welding material area disposed on the padstack to partially cover the padstack, be located at one end of the padstack, and leave a blank area on the padstack that is not covered by the welding material area, wherein the welding material area is an area for an element to be connected to contact with the padstack, and the element to be connected or a pin of the element to be connected is welded on the welding material area;
    a blocking area disposed on the layout area, wherein the blocking area comprises an opening and the padstack is disposed therein, and the blocking area encloses the padstack except one side of the padstack opposite, to the welding material area; and
    a wiring connected with the padstack and the welding material area through the opening without overlapping the blocking area, wherein the wiring overlaps, and connects with the blank area on the padstack that is not covered by the welding material area, so as to be connected with the welding material area.

8. The printed circuit board according to claim 7, wherein the padstack is in a rectangle, three sides of the rectangle are enclosed by the blocking area, and one side of the rectangle opposite to the welding material area is not enclosed.

9. The printed circuit board according to claim 7, wherein the wiring is connected with the element to be connected or the in of the element to be connected that is welded on the welding material area.

10. The printed circuit board according to claim 8, wherein the wiring is connected with the element to be connected or the pin of the element to be connected that is welded on the welding material area.

11. The printed circuit board according to claim 9, wherein at least one of the pin is welded on the welding material area, and the wiring is connected with the at least one pin.

12. The printed circuit board according to claim 10, wherein at least one of the pin is welded on the welding material area, and the wiring is connected with the at least one pin.

* * * * *